United States Patent
Mimis et al.

(10) Patent No.: US 10,277,169 B2
(45) Date of Patent: Apr. 30, 2019

(54) AMPLIFIER

(71) Applicant: KABUSHIKI KAISHA TOSHIBA, Tokyo (JP)

(72) Inventors: Konstantinos Mimis, Bristol (GB); Gavin Watkins, Bristol (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/506,264

(22) PCT Filed: May 27, 2015

(86) PCT No.: PCT/GB2015/051536
§ 371 (c)(1),
(2) Date: Feb. 24, 2017

(87) PCT Pub. No.: WO2016/189263
PCT Pub. Date: Dec. 1, 2016

(65) Prior Publication Data
US 2018/0123521 A1  May 3, 2018

(51) Int. Cl.
*H03F 1/30* (2006.01)
*H03F 1/08* (2006.01)
(Continued)

(52) U.S. Cl.
CPC .......... *H03F 1/086* (2013.01); *H03F 1/0205* (2013.01); *H03F 1/0222* (2013.01);
(Continued)

(58) Field of Classification Search
CPC .... H03F 1/30; H03F 3/04; H03F 3/20; H03G 3/30
(Continued)

(56) References Cited

U.S. PATENT DOCUMENTS 3,424,959 A * 1/1969 Gruner ................. G05D 3/1418
                                                   318/613
4,314,441 A * 2/1982 Yannone ................... F02C 9/28
                                                   60/39.281
(Continued)

FOREIGN PATENT DOCUMENTS

JP       2014-183463 A     9/2014
WO    WO 2013/174411 A1    11/2013
(Continued)

OTHER PUBLICATIONS

Choi et al., "Optimized Envelope Tracking Operation of Doherty Power Amplifier for High Efficiency Over an Extended Dynamic Range," IEEE Transactions on Microwave Theory and Techniques, 57:1508-15 (Jun. 2009).
(Continued)

*Primary Examiner* — Henry Choe
(74) *Attorney, Agent, or Firm* — Finnegan, Henderson, Farabow, Garrett & Dunner, L.L.P.

(57) ABSTRACT

In one embodiment an amplifier circuit is disclosed. The amplifier circuit comprises an amplifying device configured to amplify a radiofrequency signal, the amplifying device having an output dynamic range; a supply modulator configured to modulate a supply voltage supplied to the amplifying device when an output of the amplifying device is within a first region of the output dynamic range; a tuneable matching network coupled to an output of the amplifying device; and a load controller configured to control the tuneable matching network, when the output of the amplifying device is within a second region of the output dynamic range, and thereby modulate the load to which the output of the amplifying device is applied.

9 Claims, 10 Drawing Sheets

(51) Int. Cl.
  *H03F 1/02* (2006.01)
  *H03F 1/56* (2006.01)
  *H03F 3/193* (2006.01)
  *H03F 3/24* (2006.01)
(52) U.S. Cl.
  CPC ............ *H03F 1/0277* (2013.01); *H03F 1/56* (2013.01); *H03F 3/193* (2013.01); *H03F 3/245* (2013.01); *H03F 2200/204* (2013.01); *H03F 2200/207* (2013.01); *H03F 2200/387* (2013.01); *H03F 2200/504* (2013.01); *H03F 2200/555* (2013.01); *H03F 2203/21139* (2013.01)
(58) Field of Classification Search
  USPC ................................ 330/297, 296, 285, 133
  See application file for complete search history.

(56) References Cited

U.S. PATENT DOCUMENTS

| | | | | |
|---|---|---|---|---|
| 4,414,540 A | * | 11/1983 | Dickenson | G05B 9/02 340/508 |
| 7,202,734 B1 | | 4/2007 | Raab | |
| 7,336,514 B2 | * | 2/2008 | Amarillas | H02J 13/0006 363/124 |
| 9,247,496 B2 | * | 1/2016 | Khlat | H04W 52/0209 |
| 9,520,907 B2 | * | 12/2016 | Peng | H04B 1/0475 |
| 9,621,113 B2 | * | 4/2017 | Khlat | H03F 1/0244 |
| 2014/0285262 A1 | | 9/2014 | Kojima et al. | |

FOREIGN PATENT DOCUMENTS

| WO | WO 2015/063434 A1 | 5/2015 |
|---|---|---|
| WO | WO 2015/145097 A1 | 10/2015 |

OTHER PUBLICATIONS

Jeong et al., "Efficiency Enhancement of W-CDMA Base-Station Envelope Tracking Power Amplifiers Via Load Modulation." Microwave and Optical Technology Letters, 49:1954-57 (Aug. 2007).
Jeong et al., "Efficiency Enhancement Method for High-Power Amplifiers using a Dynamic Load Adaptation Technique," 2005 IEEE MTT-S International Microwave Symposium, pp. 2059-62 (Jun. 12, 2005).

* cited by examiner

AMPLIFIER

FIELD

Embodiments described herein relate generally to amplifier circuits having load modulation and supply modulation

BACKGROUND

Communication signals such as Long Term Evolution (LTE) data communications, Digital Television (DTV) transmissions and LTE-Advanced communications transmissions possess large peak to average power ratios (PAPR). This causes the efficiency of power amplifiers (PA) to be very low. Increasing PA efficiency is very important for both for mobile devices and stationary base station transmitters to reduce power consumption.

BRIEF DESCRIPTION OF THE DRAWINGS

In the following, embodiments will be described with reference to the drawings in which.

DETAILED DESCRIPTION

In one embodiment an amplifier circuit is disclosed. The amplifier circuit comprises an amplifying device configured to amplify a radiofrequency signal, the amplifying device having an output dynamic range; a supply modulator configured to modulate a supply voltage supplied to the amplifying device when an output of the amplifying device is within a first region of the output dynamic range; a tuneable matching network coupled to an output of the amplifying device; and a load controller configured to control the tuneable matching network, when the output of the amplifying device is within a second region of the output dynamic range, and thereby modulate the load to which the output of the amplifying device is applied.

In an embodiment, the supply modulator comprises a charge pump circuit.

In an embodiment, the first region and the second region do not overlap.

In an embodiment, the first region comprises a higher output power than the second region.

In an embodiment the amplifier circuit further comprises a supply modulator bypass circuit configured to selectively bypass the supply modulator.

In an embodiment, the supply modulator bypass circuit is configured to bypass the supply modulator when the peak-to-average power ratio of the radiofrequency signal is below a threshold.

In an embodiment, the supply modulator bypass circuit is configured to bypass the supply modulator when the supply modulator fails to operate.

In an embodiment the amplifier circuit further comprises a load controller bypass circuit configured to selectively bypass the load controller.

In an embodiment, the load controller bypass circuit is configured to bypass the load controller when the peak-to-average power ratio of the radiofrequency signal is below a threshold.

In an embodiment, the load controller bypass circuit is configured to bypass the load controller when the load controller fails to operate.

Figure 1:
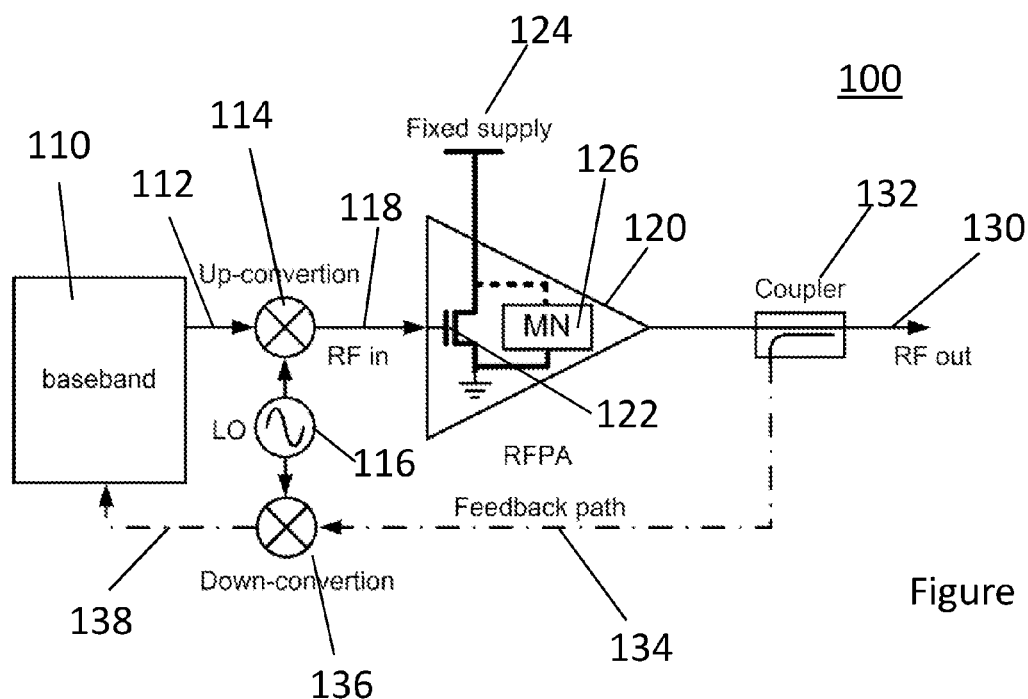
FIG. 1 shows an amplifier circuit.

FIG. 1 shows an amplifier circuit 100. The amplifier circuit 100 comprises a baseband processing module 110 and a radiofrequency power amplifier (RFPA) 120. The baseband processing module 110 outputs a baseband signal 112 which is up-converted by an up-conversion module 114 using a local oscillator (LO) 116. The up-converted signal is a radiofrequency (RF) signal 118 which is amplified by the RFPA 120. The RFPA 120 comprises an amplifying element 122. The amplifying element 122 is supplied by a fixed supply voltage 124. A matching network (MN) 126 is connected across the output of the amplifying element 122. The output of the RFPA 120 is an amplified RF signal 130. A coupler 132 couples a feedback path to the amplified RF signal 130. The feedback path carries a RF feedback signal 134. The RF feedback signal 134 is down-converted by a down-conversion module 136 using the LO 116. This provides a baseband feedback signal 138 which is fed into the baseband processing module 110.

Figure 2:
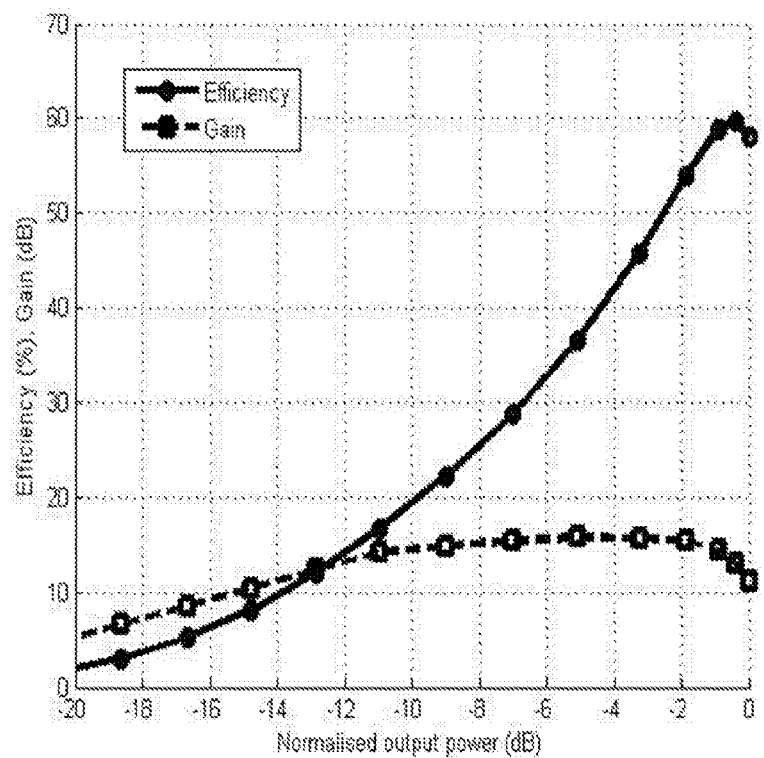
FIG. 2 shows the gain and efficiency against output power for the amplifier circuit shown in FIG. 1.

FIG. 2 shows the gain and efficiency against output power for the amplifier circuit shown in FIG. 1. As shown in FIG. 2, the gain rises from approximately 5 dB for a normalised output power of −20 dB to approximately 15 dB for a normalised output power of −10 dB. The gain then levels off at approximately 15 dB for normalised output powers between −10 dB and −2 dB. The gain drops to approximately 10 dB for a normalised output power of 0 dB. The efficiency rises from approximately 2% for a normalised output power of −20 dB to 20% for a normalised output power of −10 dB.

The efficiency then increases more rapidly with output power and reaches a peak of 60% for a normalised output power of −1 dB.

As shown in FIG. 2, amplifiers such as the one shown in FIG. 1 suffer from low efficiency. Even the combination with digital pre-distortion will still lead to average efficiency of less than 30% when amplifying and OFDM type of signal. This is shown in FIG. 2 where under a signal with 8 dB peak-to-average power ratio the amplifier is expected to have efficiency well below 30%.

Figure 3:
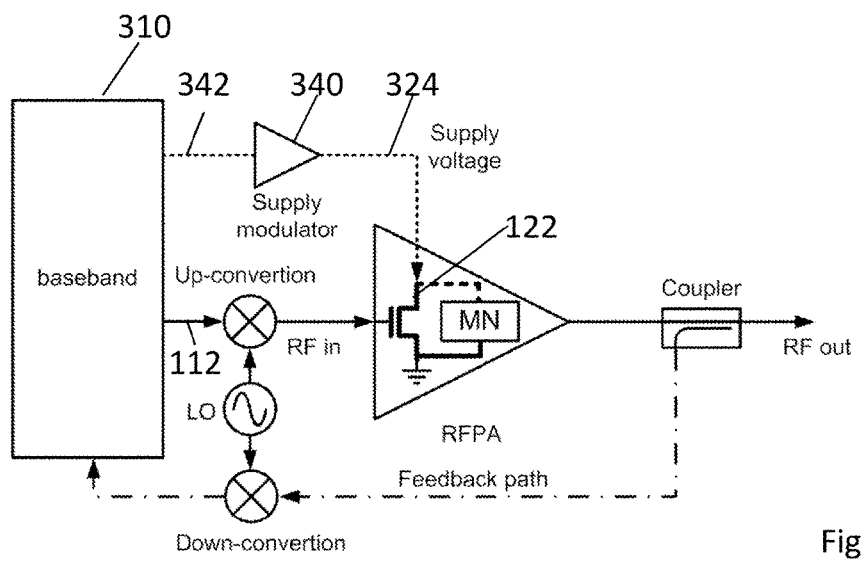
FIG. 3 shows a supply modulated amplifier circuit.

FIG. 3 shows a supply modulated amplifier circuit 300. Common reference numerals are used for elements also shown in FIG. 1. The supply modulated amplifier circuit 300 comprises a baseband processing module 310 which in addition to providing a baseband signal 112 also provides a supply modulator control signal 342. A supply modulator 340 modulates the supply voltage 324 supplied to the amplifying device 122 using the supply modulator control signal 342. The remaining features of the supply modulated amplifier circuit 300 are as described above with reference to FIG. 1.

Figure 4:
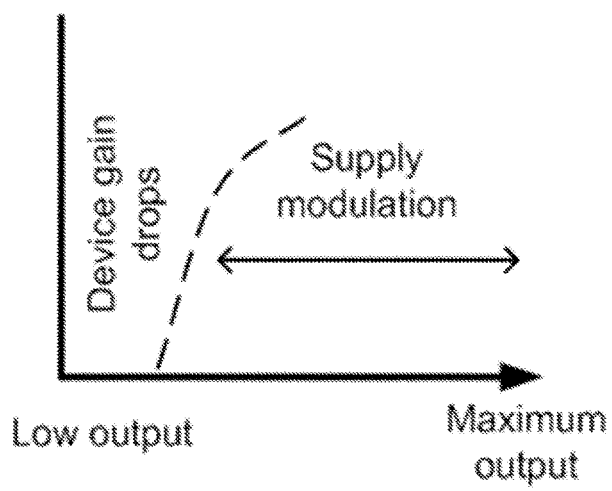
FIG. 4 shows the operating regions of the supply modulated amplifier circuit shown in FIG. 3.

FIG. 4 shows the operating regions of the supply modulated amplifier circuit shown in FIG. 3. As shown in FIG. 4, supply modulation is implemented for high output powers. However, for low output powers, the device gain drops.

Figure 5:
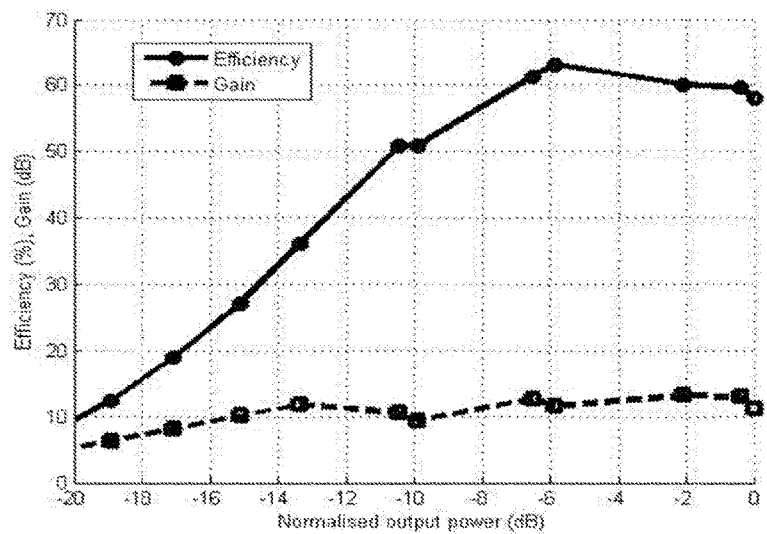
FIG. 5 shows the gain and efficiency against output power for the amplifier circuit shown in FIG. 3.

FIG. 5 shows the gain and efficiency against output power for the amplifier circuit shown in FIG. 3. As shown in FIG. 5, the efficiency is approximately 10% for a normalised output power of −20 dB, this rises to approximately 62% for a normalised output power of −6 dB and then drops to approximately 60% for normalised output powers in the range −4 dB to −1 dB. The gain rises with normalised output power from approximately 7 dB for a normalised output power of −20 dB to approximately 12 dB for a normalised output power of −2 dB.

Figure 6:
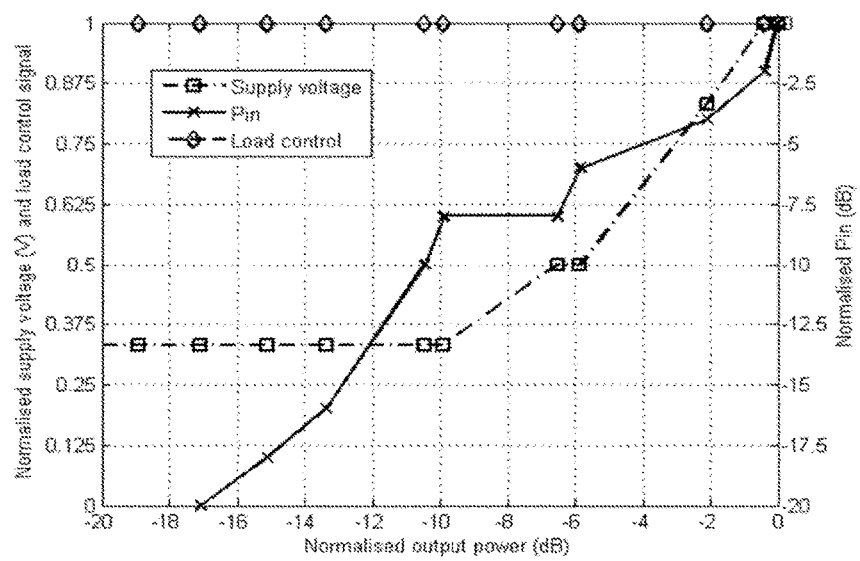
FIG. 6 shows the normalised supply voltage for the amplifier circuit shown in FIG. 3.

FIG. 6 shows the normalised supply voltage for the amplifier circuit shown in FIG. 3. The curves in FIGS. 5 and 6 result from measurements performed on a prototype of the circuit shown in FIG. 3. All the combinations of input power Pin and supply voltage were applied while measuring output power efficiency and gain. The single lines plotted for the gain, input power and supply voltage in the figures correspond to the values that lead to the maximum efficiency at each output power level. This is the curve of efficiency given in FIG. 5. As shown in FIG. 6, the normalised supply voltage is set to approximately 0.35V for normalised output powers in the range −20 dB to −10 dB. The normalised supply voltage is increased to 0.5V for normalised output powers of −7 dB to −6 dB. The normalised supply voltage is increased to 0.85V for a normalised output power of −2 dB and increased to 1V for a normalised output power of −1 dB. FIG. 6 also shows a load control signal which is has the value of 1 for all normalised output powers. This is to illustrate that the matching network 126 has a fixed impedance.

It can be seen that firstly the efficiency of the amplifier circuit 300 at the −8 dB output power region has been dramatically increased with regards to the amplifier circuit shown in FIG. 2. Secondly, the signals that control the input of the amplifier and supply voltage are monotonically increasing signals with increasing power so the frequency content of the signals driving the amplifier are not significantly increased.

The gain of the amplifier is a strong function of the supply voltage, and in general drops for low supply voltages. This is the reason also that the supply voltage is not controlled for output power lower than −10 dB. Due to the fact that the device gain depends on the supply voltage which is here not fixed, the input power has to be co-controlled with the supply voltage to maximise efficiency and linearity. This leads to the non-smooth curves of Pin versus output power.

Figure 7:
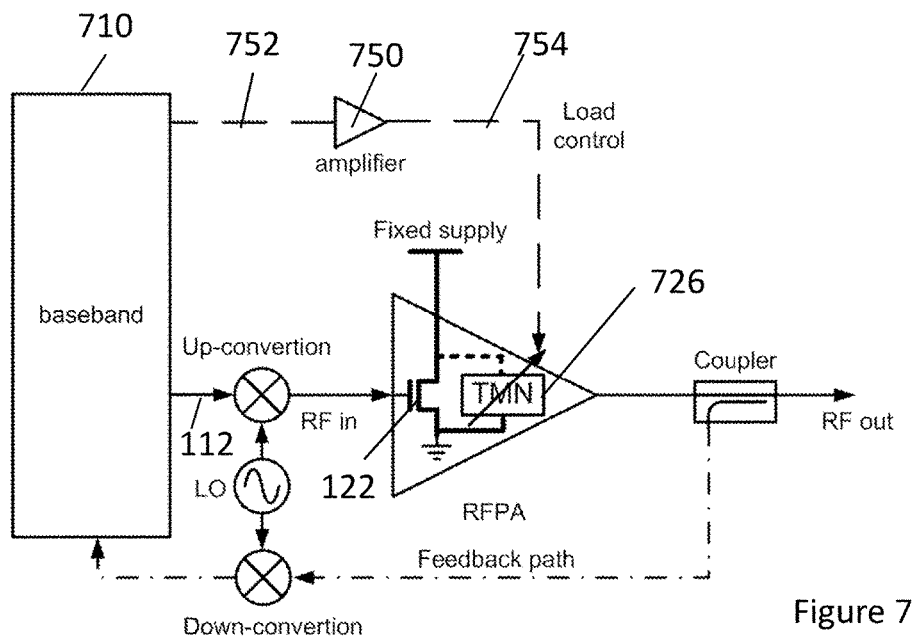
FIG. 7 shows an amplifier circuit with dynamic load modulation.

FIG. 7 shows an amplifier circuit 700 with dynamic load modulation. Common reference numerals are used for elements also shown in FIG. 1. The dynamic load modulated amplifier circuit 700 comprises a baseband processing module 710 which in addition to providing a baseband signal 112 also provides a load modulation signal 752 which is received by a load controller 750. The load controller 750 controls the impedance of a tuneable matching network (TMN) 726 coupled to the output of the amplifying element 122. The impedance of the TMN 726 is controlled by a load control signal 754. The load controller 750 is implemented as an amplifier which amplifies the load modulation signal 752 to provide the load control signal 754. The remaining features of the amplifier circuit 700 are as described above with reference to FIG. 1.

Figure 8:
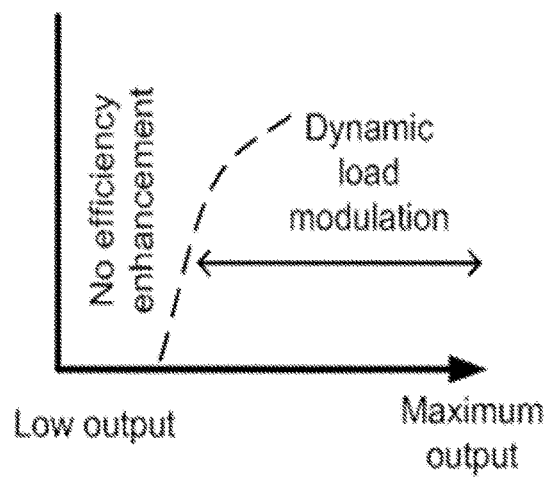
FIG. 8 shows the operating regions of the supply modulated amplifier circuit shown in FIG. 7.

FIG. 8 shows the operating regions of the load modulated amplifier shown in FIG. 7. As shown in FIG. 8, at low output powers there is no efficiency enhancement from dynamic load modulation. For high output powers, dynamic load modulation is carried out.

Figure 9:
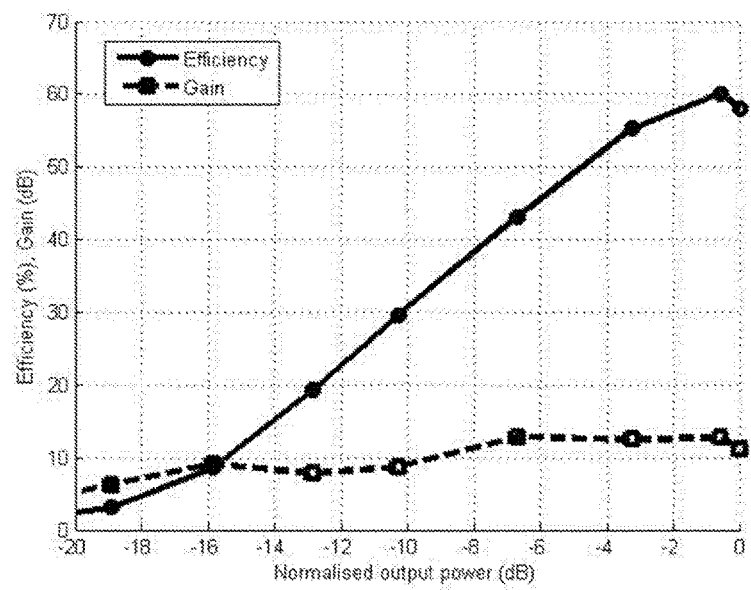
FIG. 9 shows the gain and efficiency against output power for the amplifier circuit shown in FIG. 7.

FIG. 9 shows the gain and efficiency of the dynamic load modulated amplifier circuit shown in FIG. 7. As shown in FIG. 9, the efficiency is approximately 4% for a normalised output power of −20 dB, this rises steadily to approximately 60% for a normalised output power of −1 dB. The gain rises with normalised output power from approximately 5 dB for a normalised output power of −20 dB to approximately 12 dB for a normalised output power of −2 dB.

Figure 10:
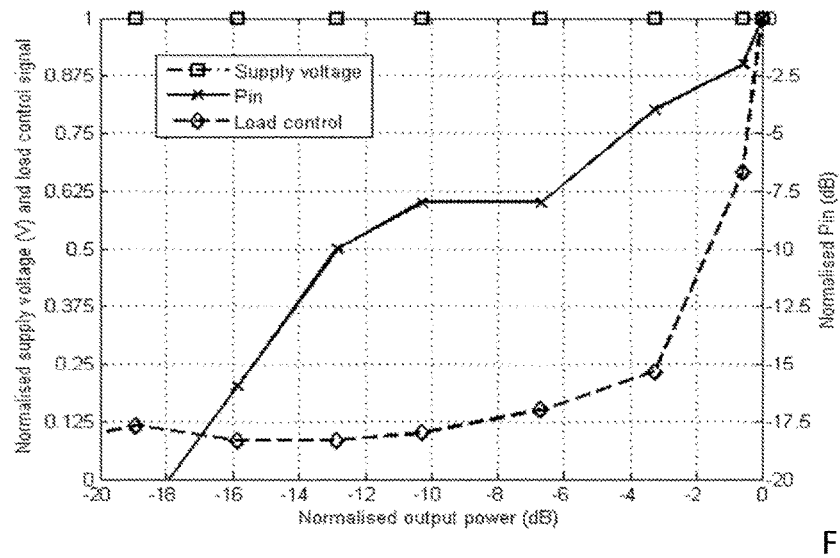
FIG. 10 shows the load control signals for the amplifier circuit shown in FIG. 7.

FIG. 10 shows the load control signal for the amplifier circuit shown in FIG. 7. As shown in FIG. 10, the supply voltage takes a single value shown as a normalised supply voltage of 1V for all normalised output powers. The normalised load control signal has a value of approximately 0.125 of a normalised output power of −20 dB. This decreases to 0.1 for normalised output powers in the range −16 dB to −10 dB. The value of the load control signal then increases to approximately 0.13 for a normalised output power of −7 dB. The value of the load control signal then increases rapidly from approximately 0.2 to approximately 0.65 for normalised output powers of −3 dB to 0 dB.

As described above, for the dynamic load modulation architecture seen in FIG. 7, a tuneable matching network (TMN) is controlled by an additional amplifier. This is relatively easy to design compared to the supply modulator described before. This is because of the low drive current requirement which additionally doesn't have a large impact on system efficiency. The required current is as low as 1% of that from a supply modulator. This architecture still provides a large efficiency increase compared to the single stage system, but not as high as supply modulation. This is due to two reasons. First, because of the different loss mechanisms involved in the two systems which favour supply modulation and second due to the finite tuning range that practical TMN can provide—between 1:3 and 1:6—as shown in FIG. 10. Similarly, the drive signals are monotonically increasing functions which are appealing so that the signals will not show large frequency expansion.

Figure 11:
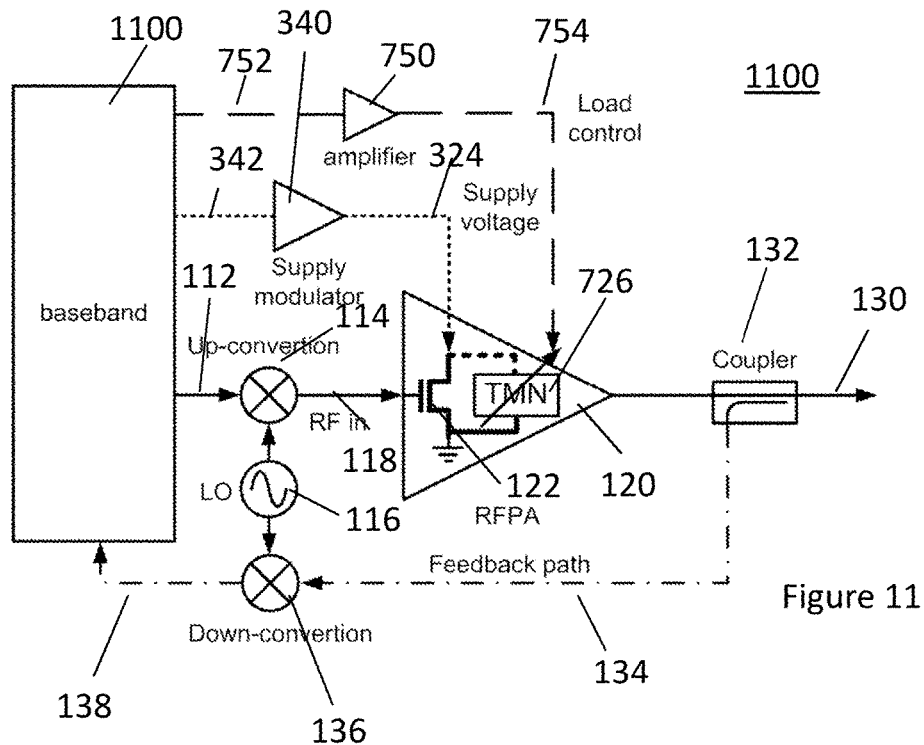
FIG. 11 shows an amplifier circuit according to an embodiment.

FIG. 11 shows an amplifier circuit 1100 according to an embodiment. The amplifier circuit 1100 uses a combination of supply modulation and dynamic load modulation to extend its high efficiency dynamic range.

The amplifier circuit 1100 comprises a baseband processing module 1110 and a radiofrequency power amplifier (RFPA) 120. The baseband processing module 1110 is coupled to an amplifier 750, which acts as a load controller, and a supply modulator 340. The RFPA 120 comprises an amplifying element 122. A tuneable matching network (TMN) 726 is coupled to the output of the amplifying element 122. The load controller is configured to control the impedance of the TMN 726. The supply modulator 340 is coupled to the amplifying element 122. The output of the RFPA is coupled to a feedback path by a coupler 130.

The baseband processing module 1100 outputs a baseband signal 112, a supply modulator control signal 342 and a load modulation signal 752. The baseband signal is up-converted by an up-conversion module 114 using a local oscillator (LO) 116. The up-converted signal is a radiofrequency (RF) signal which is amplified by the RFPA 120.

The RF signal 118 is supplied to the gate of the amplifying element 122. A supply voltage 324 supplied to the drain of the amplifying element 122 is modulated by the supply modulator 340. The impedance of the TMN 726 is controlled by a load control signal 754. The load controller amplifier 750 amplifies the load modulation signal 752 to provide the load control signal 754.

A coupler 132 couples a feedback path to the amplified RF signal 130. The feedback path carries a RF feedback signal 134. The RF feedback signal 134 is down-converted by a down-conversion module 136 using the LO 116. This provides a baseband feedback signal 138 which is fed into the baseband processing module 110.

Figure 12:
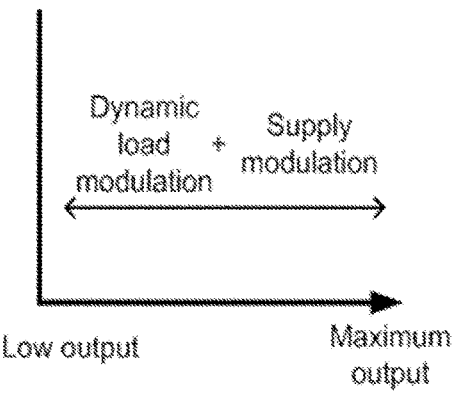
FIG. 12 shows the operating regions of the supply modulated amplifier circuit shown in FIG. 11.

The amplifier circuit shown in FIG. 11 operates with supply and load modulation at each output power level as indicated in FIG. 12. These combinations can be determined using calibration and characterisation procedures.

FIG. 12 shows an example of the control of the dynamic load modulation and supply modulation used with the amplifier circuit of FIG. 11. As shown in FIG. 12, the dynamic load modulation and the supply modulation are used together across a range of output powers.

Figure 13:
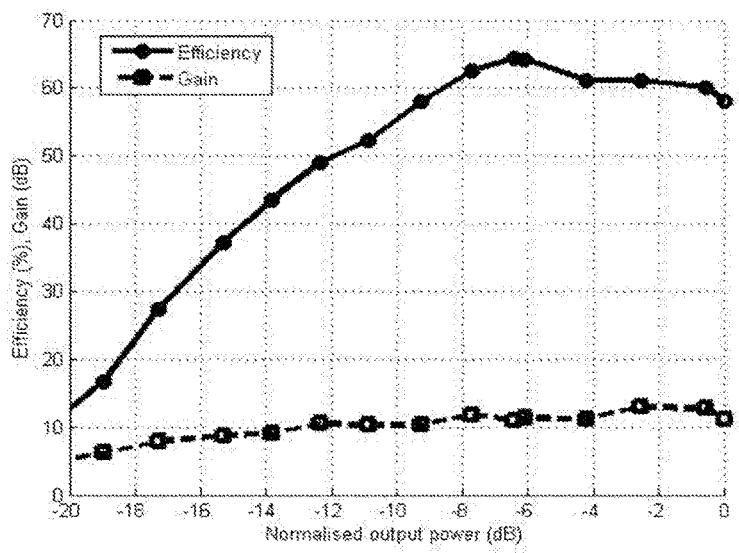
FIG. 13 shows the gain and efficiency against output power for the amplifier circuit shown in FIG. 11.

FIG. 13 shows the shows the gain and efficiency against output power for the amplifier circuit shown in FIG. 11. As shown in FIG. 13, the efficiency is approximately 12% for a normalised output power of −20 dB, this rises to approximately 65% for a normalised output power of −6 dB and then drops to approximately 60% for normalised output powers in the range −4 dB to −1 dB. The gain rises with normalised output power from approximately 7 dB for a normalised output power of −20 dB to approximately 12 dB for a normalised output power of −2 dB.

Figure 14:
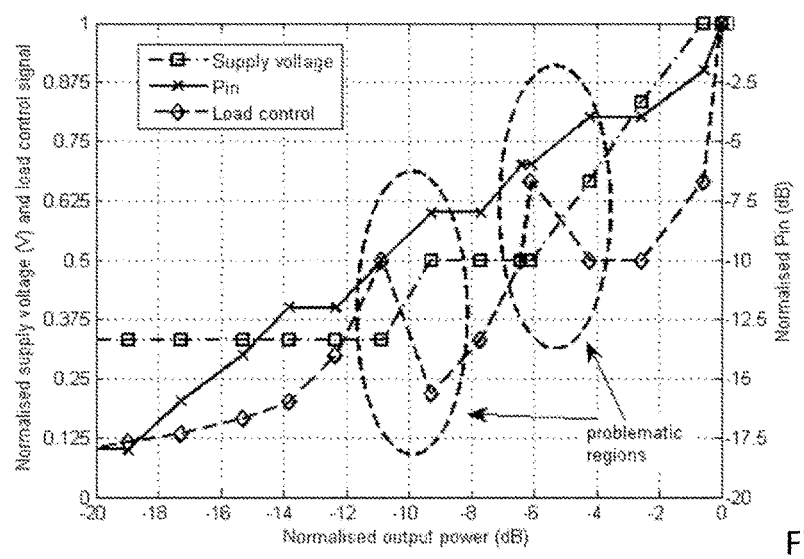
FIG. 14 shows the normalised supply voltage and load control signal for the amplifier circuit shown in FIG. 11.

FIG. 14 shows an example of the normalised supply voltage and load control signal for the amplifier circuit shown in FIG. 11 using dynamic load modulation and supply modulation together as described in relation to FIG. 12. The curves presented here are representative of amplifiers of the type described in relation to FIG. 12, however those of skill in the art will appreciate that the values will vary between different implementations. Those of skill in the art will also appreciate that this also applies to the other curves described.

As shown in FIG. 14, the supply voltage is set at 0.3V for normalised output powers of −20 dB to −11 dB, and then increases to 0.5V for normalised output powers of −11 dB to −6 dB. From normalised output powers −6 dB to −1 dB, the supply voltage is increased with output power from 0.5V to 1V. The normalised load control signal has a value of approximately 0.125 of a normalised output power of −20 dB. This increases to approximately 0.2 for a normalised output power of −14 dB, then increases more rapidly to 0.5 for normalised output power of −11 dB. The value of the load control signal then drops to approximately 0.22 for a normalised output power of −9 dB. The value of the load control signal increases from approximately 0.2 to approximately 0.65 for normalised output powers of −9 dB to −6 dB. The value of the load control signal drops from approximately 0.65 to 0.5 when the normalised output power changes from −6 dB to −4 dB. The value of the load control signal increases from 0.5 for a normalised output power of −3 dB to 1 for a normalised output power of 0 dB.

A first problem is that the very high complexity of the supply modulator will be present in this system. This is because the supply voltage of the RFPA has to be modulated at a fast speed to increase its efficiency. The problem occurs because the supply modulator has to provide a large current to the amplifier which has also has fast, that is high frequency components. It is difficult to achieve both of these conditions without having a very complex or power inefficient modulator. This is because a large size of transistors would be needed to provide the large current which makes them inefficient in high frequencies. Topologies exist to combat this which split the signal in a low and high frequency components and amplify the components separately before recombining them to feed the amplifier. However, due to the multiple paths that exist in such modulators their design is complex. As shown in FIG. 13, the efficiency and gain characteristics of the amplifier circuit are improved by using both load modulation and supply modulation. However, as shown in FIG. 14, the load control signal has problematic regions in which it is not a monotonically increasing function. The problematic regions are marked in the plot. These will introduce abrupt changes of the signal in the time domain, causing its frequency content to expand. This is problematic both for the digital to analogue converter driving the system input, and also for parts of the circuitry as the frequency response of the circuitry in that path will have to be able to accommodate the high frequency components.

Figure 15:
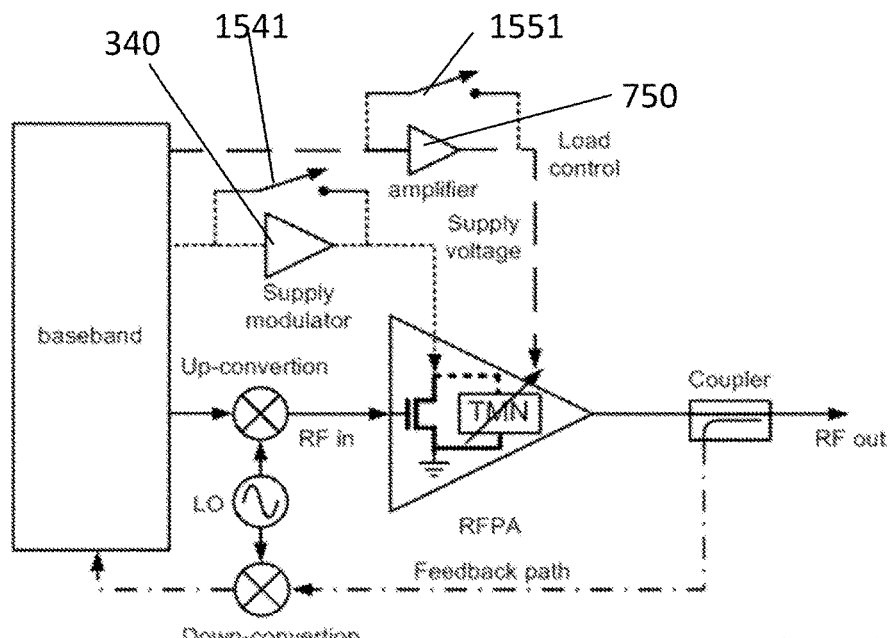
FIG. 15 shows an amplifier circuit according to an embodiment.

FIG. 15 shows an amplifier circuit 1500 according to an embodiment. The amplifier circuit 1500 uses a combination of supply modulation and dynamic load modulation to extend its high efficiency dynamic range. The amplifier circuit 1500 has a supply modulator bypass switch 1541 and a load controller bypass switch 1551. The remainder of the amplifier circuit is as described above in relation to FIG. 11. The supply modulator bypass switch 1541 allows the supply modulator 340 to be bypassed. The load controller bypass switch 1551 allows the load controller 750 to be bypassed.

The amplifier circuit shown in FIG. 15 can adapt its operation based on the characteristics of the input signal. If the peak-to-average power ratio (PAPR) is low, dynamic load modulation or supply modulation can be disabled by bypassing respectively, the load controller 750 or the supply modulator 340.

Additionally, or alternatively, the supply modulator 340 or the load controller 750 can bypassed in case the associated circuitry is damaged and is malfunctioning. This allows the amplifier circuit to still operate if parts of it are damaged. As shown in FIG. 15, bypassing mechanisms are included so that if the supply modulator fails, a fixed supply voltage can be provided while dynamic load modulation will still provide some efficiency enhancement. In a similar fashion, if the TMN or the TMN amplifier fails and cannot modulate the load showing static impedance to the amplifier, the load control signal can be bypassed and only supply modulation will enhance the efficiency. The bypass switches may be controlled by the baseband processing module 1510 on the basis of the baseband feedback signal 138.

Thus such embodiments provide a flexible amplifying circuit. Depending on the signal characteristics the amplifier circuit can adapt its operation for better performance. For example, if only a signal with 5-6 dB PAPR is amplified, the supply modulator and analogue to digital converter (ADC) driving it can be switched off reducing the power consumption while still providing sufficient efficiency enhancement for the PA. As soon as the PAPR of the signal increases, supply modulation can be re-introduced. Such control may be implemented by the base band processing module 1310.

Figure 16:
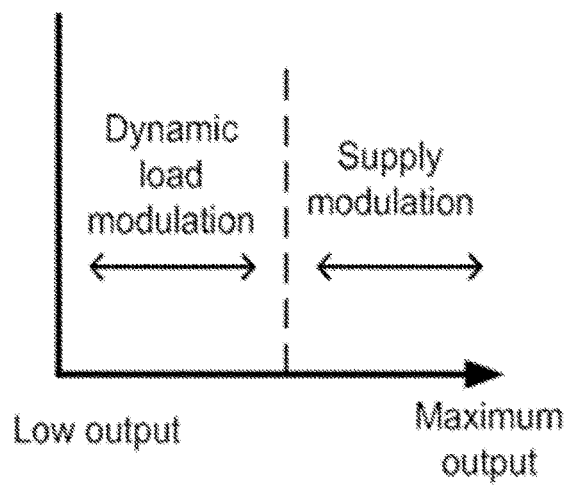
FIG. 16 shows the operating regions of the amplifier circuit shown in FIG. 15.

FIG. 16 shows the operating regions of the amplifier circuit 1500 shown in FIG. 15. As shown in FIG. 16, the dynamic load modulation is operated in a low output power region and the supply modulation is operated in a high output power region. In the example shown in FIG. 16, the two operating regions do not overlap.

Figure 17:
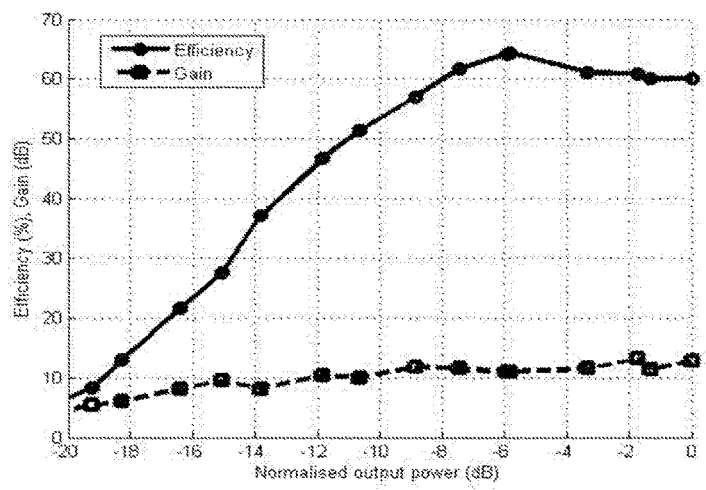
FIG. 17 shows the gain and efficiency against output power for the amplifier circuit shown in FIG. 15 operated with the operating regions shown in FIG. 16.

FIG. 17 shows the shows the gain and efficiency against output power for the amplifier circuit shown in FIG. 15 operated with the operating regions shown in FIG. 16. As shown in FIG. 17, the efficiency is approximately 8% for a normalised output power of −20 dB, this rises to approximately 65% for a normalised output power of −6 dB and then drops to approximately 60% for normalised output powers in the range −4 dB to −1 dB. The gain rises with normalised output power from approximately 7 dB for a normalised output power of −20 dB to approximately 12 dB for a normalised output power of −2 dB.

From a comparison of FIGS. 17 and 13, it can be seen that by separating the operating regions as described in relation of FIG. 16, there is a small decrease in efficiency for low output powers.

Figure 18:
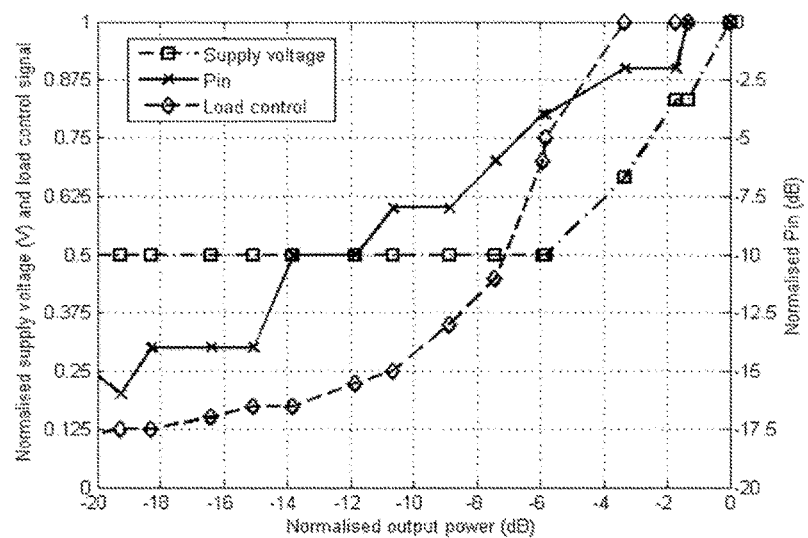
FIG. 18 shows the normalised supply voltage and load control signal for the amplifier circuit shown in FIG. 15 using dynamic load modulation and supply modulation in separate regions as described in relation to FIG. 16.

FIG. 18 shows the normalised supply voltage and load control signals for the amplifier circuit shown in FIG. 15 using dynamic load modulation and supply modulation in separate regions as described in relation to FIG. 16. As shown in FIG. 18, the supply voltage is set at 0.5V for normalised output powers in the range of −20 dB to 6 dB, and then increases gradually to 1V over the range of normalised output powers of −6 dB to 0 dB.

The normalised load control signal has a value of approximately 0.125 of a normalised output power of −20 dB. This increases to approximately 0.25 for a normalised output power of −11 dB. The value of the load control signal then increases more rapidly with normalised output power to reach a value of 1 for a normalised output power of −4 dB. The load control signal remains at the value of 1 for all normalised output powers greater than −4 dB.

As shown in FIG. 18, the dependence of both the supply voltage and the load control signal on the normalised output power is monotonic. As avoids the introduction of high frequency components into the control signals and simplifies the circuit requirements. The separation of the modes also provides ease of practical implementation. If the two modes are not separated, driving the system becomes extremely challenging if not impossible, especially with broadband signals like LTE-Advanced.

In an embodiment, the supply modulator is implemented as a charge pump modulator. This provides a relatively simple and efficient modulator. Other modulator types could also be used.

Figure 19:
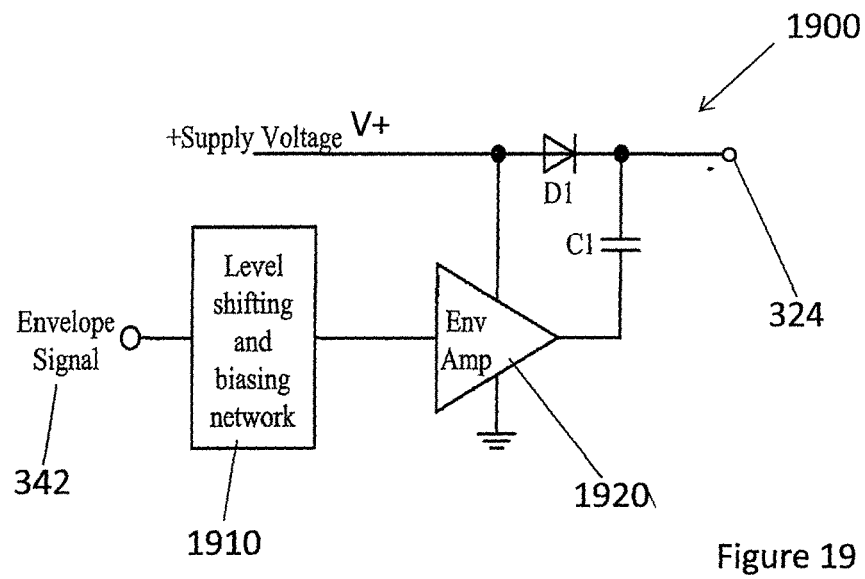
FIG. 19 shows a supply modulator implemented as a charge pump modulator in an embodiment.

FIG. 19 shows a supply modulator implemented as a charge pump modulator in an embodiment. The supply modulator 1900 comprises a level shifting and biasing network 1910, an envelope amplifier 1920 a diode D1 and a capacitor C1.

The supply modulator 1900 provides a supply voltage 324 for the RFPA based in response to an envelope signal 342. The envelope signal 342 is the supply modulator control signal 342 provided by the baseband processing module in the embodiments described above.

A modulator supply voltage V+ is provided to the envelope amplifier 1920. The modulator supply voltage V+ is coupled to the supply voltage 324 of the RFPA by the diode D1. The envelope signal 342 is coupled to the level shifting and biasing network 1910. The output from the level shifting and biasing network 1910 is coupled to the input of the envelope amplifier 1920. The capacitor C1 is connected between the output of the envelope amplifier 1920 and the supply voltage 324 of the RFPA.

The supply modulator 1900 is configured so that the envelope amplifier 1920 does not track the entire envelope of an input RF signal. When the desired output voltage is below a threshold, the output from the level shifting and biasing network 1910 is set to zero and therefore the output of the envelope amplifier 1920 is zero. In this operating regime, the modulator supply voltage V+ is coupled to the supply voltage 324 of the RFPA. In this operating regime, the capacitor C1 is charged by a current flowing through the diode D1.

When the desired output voltage is above the threshold, the level shifting and biasing network 1910 provides an input signal to the envelope amplifier 1920. This results a voltage at the output of the envelope amplifier 1920. Since the capacitor C1 is charged with a voltage of V+, the result is that the output voltage of the envelope amplifier 1920 is added to the voltage V+. Thus the capacitor C1 acts a charge pump and the supply modulator 1900 can supply an output voltage 324 which is greater than the modulator supply voltage V+.

Figure 20:
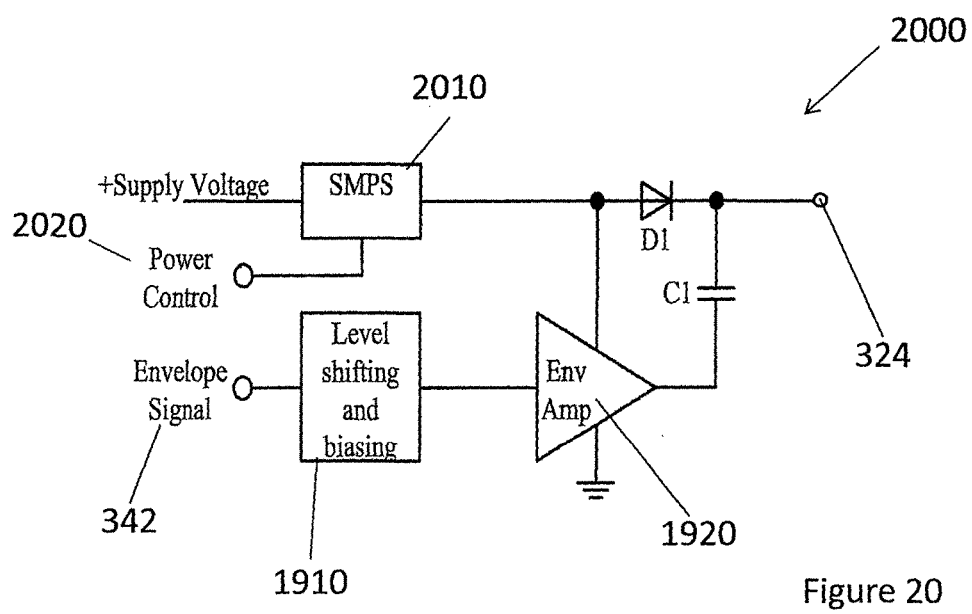
FIG. 20 shows a supply modulator implemented as a charge pump modulator in an embodiment.

FIG. 20 shows a supply modulator implemented as a charge pump modulator in an embodiment. The supply modulator 2000 shown in FIG. 20 comprises a switched mode power supply (SMPS) 2010 which is controlled by a power control signal 2020. The power control signal 2020 is provided by the baseband processing module described above. The remaining features of the supply modulator 2000 shown in FIG. 20 are as described above with reference to FIG. 19. The addition of the SMPS 2010 in the supply modulator 2000 provides the advantage of achieving output power control which increases the overall efficiency of the circuit.

While certain embodiments have been described, these embodiments have been presented by way of example only, and are not intended to limit the scope of the inventions. Indeed, the novel amplifier circuits described herein may be embodied in a variety of other forms; furthermore, various omissions, substitutions and changes in the methods and devices described herein may be made without departing from the spirit of the inventions. The accompanying claims and their equivalents are intended to cover such forms or modifications as would fall within the scope and spirit of the inventions.

The invention claimed is:

1. An amplifier circuit comprising
an amplifying device configured to amplify a radiofrequency signal, the amplifying device having an output power dynamic range;
a supply modulator configured to modulate a supply voltage supplied to the amplifying device only when an output power of the amplifying device is within a first region of the output power dynamic range;
a tuneable matching network coupled to an output of the amplifying device; and a load controller configured to control the tuneable matching network, only when the output power of the amplifying device is within a second region of the output power dynamic range that does not overlap with the first region of the output power dynamic range, and thereby modulate the load to which the output of the amplifying device is applied.

2. An amplifier circuit according to claim 1, wherein the supply modulator comprises a charge pump circuit.

3. An amplifier circuit according to claim 1, wherein the first region comprises a higher output power than the second region.

4. An amplifier circuit according to claim 1, further comprising a supply modulator bypass circuit configured to selectively bypass the supply modulator.

5. An amplifier circuit according to claim 4, wherein the supply modulator bypass circuit is configured to bypass the supply modulator when the peak-to-average power ratio of the radiofrequency signal is below a threshold.

6. An amplifier circuit according to claim 4, wherein the supply modulator bypass circuit is configured to bypass the supply modulator when the supply modulator fails to operate.

7. An amplifier circuit according to claim 1, further comprising a load controller bypass circuit configured to selectively bypass the load controller.

8. An amplifier circuit according to claim 7, wherein the load controller bypass circuit is configured to bypass the load controller when the peak-to-average power ratio of the radiofrequency signal is below a threshold.

9. An amplifier circuit according to claim 7, wherein the load controller bypass circuit is configured to bypass the load controller when the load controller fails to operate.

* * * * *